(12) United States Patent
Orikabe et al.

(10) Patent No.: US 6,335,417 B1
(45) Date of Patent: Jan. 1, 2002

(54) MODIFIED POLYIMIDE RESIN AND THERMOSETTING RESIN COMPOSITION CONTAINING THE SAME

(75) Inventors: Hiroshi Orikabe; Tadahiko Yokota, both of Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 0 days.

(21) Appl. No.: 09/581,543

(22) PCT Filed: Jan. 13, 1999

(86) PCT No.: PCT/JP99/00075

§ 371 Date: Aug. 17, 2000

§ 102(e) Date: Aug. 17, 2000

(87) PCT Pub. No.: WO99/36454

PCT Pub. Date: Jul. 22, 1999

(30) Foreign Application Priority Data

Jan. 14, 1998 (JP) .......................................... 10/006044

(51) Int. Cl.[7] ........................ C08G 73/10; C08G 18/80; C08L 79/08
(52) U.S. Cl. ........................... 528/170; 528/45; 528/65; 528/75; 528/353; 528/173; 528/176; 525/422; 525/434; 525/436; 525/440; 428/458
(58) Field of Search ................................. 528/353, 170, 528/173, 75, 65, 45, 176; 525/422, 440, 436, 434; 428/458

(56) References Cited

U.S. PATENT DOCUMENTS 4,245,067 A * 1/1981 Naekawa et al. ............ 525/440
6,162,889 A * 12/2000 Orikabe et al. ................ 528/75

FOREIGN PATENT DOCUMENTS

JP 07216339 A * 8/1995

\* cited by examiner

*Primary Examiner*—P. Hampton-Hightower
(74) *Attorney, Agent, or Firm*—Oblon, Spivak, McClelland, Maier & Neustadt, P.C.

(57) ABSTRACT

A novel modified polyimide resin having a polybutadiene sheleton and obtainable by reacting the following three (3) kinds of compounds, i.e., a bifunctional hydroxyl-terminal polybutadiene having a number average molecular weight of 800 to 5,000, a tetrabasic acid dianhydride, and a diisocyanate compound, imparts reduced shrinkage upon setting to a thermosetting resin composition comprising the same and also imparts heat resistance and pliability and the like to a hardened mass or article of such thermosetting resin composition. Therefore, such thermosetting resin composition is an excellent resin composition capable of fully satisfying the requirements with regard to the characteristics of an overcoat agent for a wiring circuit which should be pliable, such as a flexible wiring circuit substrate, a film carrier and the like.

14 Claims, 1 Drawing Sheet

MODIFIED POLYIMIDE RESIN AND THERMOSETTING RESIN COMPOSITION CONTAINING THE SAME

TECHNICAL FIELD

The present invention relates to a modified polyimide resin which is useful in imparting reduced shrinkage upon setting to a thermosetting resin composition and also useful in imparting heat resistance and pliability and the like to a hardened article of such thermosetting resin composition (hardened resin), and to a thermosetting resin composition containing the same, as well as to a film carrier comprising a surface protection film formed by coating an overcoat agent containing such composition as the main component followed by setting it, and to a carrier device employing such film carrier.

BACKGROUND ART

The surface protection films of flexible wiring circuits have heretofore been produced, e,g., by a method in which a polyimide film called a coverlay film is punched with a metal template having a certain pattern and then bound with an adhesive or a method in which an overcoat agent containing as the main component a UV setting resin imparted with a flexibility or a thermosetting resin is applied by a screen printing and then allowed to set. However, since a coverlay film method has a disadvantage in terms of an processability and a method employing an overcoat agent involves a problematic warping upon setting as well as a poor pliability of a hardened resin, there is still no method for forming a surface protective film for a flexible wiring circuit substrate whose performance satisfies all requirements.

On the other hand, the so-called TAB method employing a film carrier suitable in imparting a higher density and a less thickness to a liquid crystal-driving IC package, has got increasingly employed recently. A basic structure of a film carrier is mainly composed of a heat-resistant, insulating film substrate, such as one made from a polyimide, and an electrical conductor such as copper foil, bound thereto via an adhesive whose main component is an epoxy-based resin, the wiring pattern having been formed on the copper foil by etching. A film carrier device is made by connecting an IC to a film carrier (referred to also as a tape carrier) followed by confining with the use of a confining resin, and the film carrier is generally covered with a surface protecting film from an overcoat agent for the purpose of preventing reduction in reliability due to the occurrence of a pattern short, erosion, migration, whiskering and the like during the step before connecting an IC. While an overcoat agent employed for a film carrier has been an epoxy-based one or a polyimide-based one, the former has not been satisfactory because of warping upon setting and a poor pliability of the resultant film, and the latter has not been satisfactory in terms of adherence to an IC confining resin and a processability, resulting in the fact that two or more overcoat agent have been employed to compensate each other for their shortages (JP-A 6-283575).

Under the circumstance of the prior art described above, an object of the present invention is to provide a resin composition capable of fully satisfying the requirements with regard to the characteristics of an overcoat agent for a wiring circuit which should be pliable, such as a flexible wiring circuit substrate and a film carrier.

DISCLOSURE OF THE INVENTION

We have made an effort to solve the problems described above, and finally discovered that a modified polyimide resin having a polybutadiene skeleton represented by Formula (4) shown below is extremely useful as a component of an overcoat agent for a flexible wiring circuit substrate and a film carrier, more specifically, that a thermosetting resin composition obtained by mixing a polybutadiene polyol having a number average molecular weight of 1,000 to 8,000 and 2 to 10 hydroxyl groups per molecule (Component A), a modified polyimide resin represented by Formula (4) shown below (Component B) and a polybutadiene polyblock isocyanate having a number average molecular weight of 1,000 to 8,000 and 2 to 10 hydroxyl groups per molecule (Component C) at a certain ratio, can serve as a resin composition for an overcoat which has a performance capable of satisfying the requirements with regard to various characteristics, including reduced shrinkage upon setting, and pliability, tight adherence, electric insulation, chemical resistance and heat resistance of a hardened article, thus establishing the present invention.

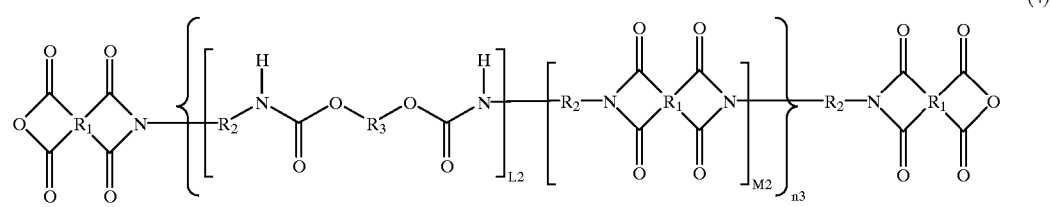

(4)

wherein $R_1$ represents the residue obtainable by removing all the carboxyl groups from an organic compound having 4 carboxyl groups (tetrabasic acid), $R_2$ represents the residue obtainable by removing all the isocyanate groups from an organic compound having 2 isocyanate groups, and $R_3$ represents the residue obtainable by removing the hydroxyl group from a hydroxyl-terminal polybutadiene; L2 and M2 represent the ratio of the number the component polybutadiene units and the ratio of the number of the component polyimide units, respectively, to the total number of both the kinds of units and n3 represents a degree of polymerization, provided that $L2+M2=1, 0<L2<1, 0<M2<1$ and $1 \leq n3 \leq 1,000$ simultaneously.

Accordingly, the present invention relates, firstly, to a modified polyimide resin obtainable by reacting the following three (3) kinds of compounds, i.e., a bifunctional hydroxyl-terminal polybutadiene having a number average molecular weight of 800 to 5,000 (Compound a), a tetrabasic acid dianhydride represented by Formula (1) (Compound b):

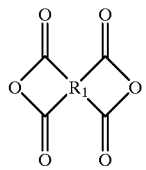

(1)

wherein $R_1$ represents the residue obtainable by removing all the carboxyl groups from an organic compound having 4 carboxyl groups, and a diisocyanate compound (Compound c), said modified polyimide resin being represented by Formula (2):

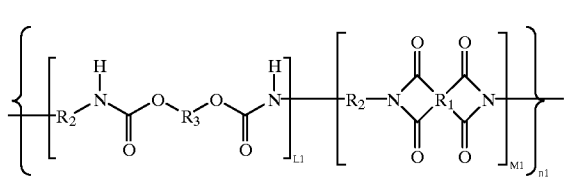

(2)

wherein $R_1$ represents the residue obtainable by removing all the carboxyl groups from an organic compound having 4 carboxyl groups, $R_2$ represents the residue obtainable by removing all the isocyanate groups from an organic compound having 2 isocyanate groups, and $R_3$ represents the residue obtainable by removing the hydroxyl group from a hydroxyl-terminal polybutadiene; L1 and M1 represent the ratio of the number of the component polybutadiene units and the ratio of the number of the component polyimide units, respectively, to the total number of both the kinds of units and n1 represents a degree of polymerization, provided that $L1+M1=1$, $0<L1<1, 0<M1<1$ and $1 \leq n1 \leq 10,000$ simultaneously.

The present invention relates also to various modified polyimide resins obtainable by specifying inter alia amounts of the starting materials for their synthesis. There may be mentioned as such modified polyimide resins, e.g., a first modified polyimide resin represented by Formula (2) shown above, and obtainable by reaction between an isocyanate group-containing product (Starting material 1, isocyanate equivalent number:X equivalent(s)) which can be obtained by reacting a bifunctional hydroxyl-terminal polybutadiene having a number average molecular weight of 800 to 5,000 (Compound a) with a diisocyanate compound (Compound c) at a hydroxyl groups:isocyanate groups ratio of 1:1.5 to 2.5 in terms of equivalent number, and a tetrabasic acid dianhydride represented by Formula (1) shown above (Starting material 2, acid anhydride equivalent number: Y equivalent (s)), the isocyanate-group containing product being represented by Formula (3):

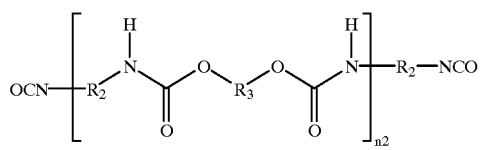

(3)

wherein $R_2$ represents the residue obtainable by removing all the isocyanate groups from an organic compound having 2 isocyanate groups, and $R_3$ represents the residue obtainable by removing the hydroxyl group from a hydroxyl-terminal polybutadiene; n2 represents a degree of polymerization, provided that $0 \leq n2 \leq 100$; a second modified polyimide resin represented by Formula (4) shown above and obtainable by reaction between Starting materials 1 and 2 in amounts in terms of equivalent numbers satisfying $Y>X \geq Y/3, 0<X$ and $0<Y$ simultaneously in the above reaction; a third modified polyimide resin represented by Formula (2) shown above, and obtainable by reacting a modified polyimide resin represented by Formula (4) shown above, further with an isocyanate group-containing product represented by Formula (3) shown above and/ or a diisocyanate compound described above (Starting material 3, isocyanate equivalent number: Z equivalent (s)); and a fourth modified polyimide resin represented by Formula (4), and obtainable by reacting Starting materials 1, 2 and 3 in amounts in terms of equivalent numbers satisfying $Y \geq (X+Z) \geq Y/3$, $0.2 \leq (Z/X) \leq 5$, $0<X$, $0<Y$ and $0 \leq Z$ simultaneously.

The present invention relates, thirdly, to an insulating resin composition for overcoat of flexible circuits comprising, as the essential component, the following three kinds of components, i.e., a polybutadiene polyol having a number average molecular weight of 1,000 to 8,000 and having 2 to 10 hydroxyl groups per molecule (Component A), a modified polyimide resin described above (Component B) and a polybutadiene polyblock isocyanate having a number average molecular weight of 1,000 to 8,000 and having 2 to 10 block isocyanate groups per molecule (Component C), wherein the weight ratio of Component A and Component B is a (A):(B) ratio of 40:60 to 90:10 in terms of solid matter, and also wherein the amount in terms of equivalent number of the polyblock isocyanate is 0.8 to 3.5 times the sum of the hydroxyl group equivalent number of Component A and the acid anhydride equivalent number of Component B.

The present invention relates, finally, to a film carrier comprising an insulating film and a pattern formed thereon of metal thin film, with a part or all of the insulating film in the folded region having been removed, wherein the circuit pattern side except the joint region including the folded region, is coated with an overcoat composition whose main component is the resin composition as described above, and a film carrier device employing the film carrier as described above.

The present invention will be described below in greater detail.

The modified polyimide resin of the present invention means mainly those modified polyimide resins represented by Formula (2) shown above, and obtainable by reacting the following three kinds of compounds, i.e., a bifunctional hydroxyl-terminal polybutadiene having a number average molecular weight of 800 to 5,000 (Compound a), a tetrabasic acid dianhydride (Compound b) represented by Formula (1) shown above, and a diisocyanate compound (Compound c).

For the polyimide units to be efficiently incorporated into the resin, they are preferably synthesized as follows. That is, a modified polyimide resin represented by Formula (2) shown above can be obtained by reacting a bifunctional hydroxyl-terminal polybutadiene having a number average molecular weight of 800 to 5,000 (Compound a) with a diisocyanate compound (Compound c) at a hydroxyl groups:isocyanate groups ratio of 1:1.5 to 2.5 in terms of equivalent number, to obtain an isocyanate group-containing product represented by Formula (3) shown above (isocyanate equivalent number:X equivalent(s)) followed by reacting the isocyanate group-containing product with a tetrabasic acid dianhydride represented by Formula (1) shown above (Compound b, acid anhydride equivalent number: Y equivalent(s)). Alternatively, a compound represented by Formula (3) and a compound represented by Formula (1) (Compound b) are reacted with each other in amounts in terms of equivalent numbers satisfying $Y>X \geq Y/3, 0<X$ and $0<Y$ simultaneously, in the above reaction, to obtain a modified polyimide resin represented by Formula (4), which resin is then reacted with an isocyanate group-containing product represented by Formula (3) shown above and/or a diisocyanate compound described above (Starting material 3, isocyanate equivalent number: Z equivalent(s)), whereby a modified polyimide resin represented by Formula (2) can be obtained. Incidentally, the equivalent number of an isocyanate to be reacted with a modified polyimide resin represented by Formula (4) is expressed as Z, which represents a total equivalent number when only one of or both of an isocyanate group-containing product represented by Formula (3) and a diisocyanate compound (Compound c) are employed. Unless an attention is paid to the reaction conditions as described above, side reactions such as a reaction between an acid anhydride group and a hydroxyl group or a reaction between isocyanates may occur, or a reaction between an isocyanate group and an acid anhydride group may be predominant, resulting in precipitation of polyimide unit(s) only, which may lead to difficulties in integrating a polyimide unit into a resin backbone efficiently, thus resulting in a possibility that a resin having excellent mechanical properties and hydrolysis resistance is not obtained.

Furthermore, a high-molecular compound having too a large molecular weight generally has a higher viscosity of a resin solution, because of which it becomes to involve difficulties in being used as a resin composition such as an overcoat agent. Accordingly, it is preferable to vary the ratio of the starting materials for a resin appropriately to avoid an excessive increase in the molecular weight. Thus, an isocyanate group-containing product represented by Formula (3) (Starting material 1, isocyanate equivalent number: X equivalent(s)) and a tetrabasic acid dianhydride represented by Formula (1) (Starting material 2, acid anhydride equivalent number: Y equivalent(s)) are charged into a reactor in amounts in terms of equivalent numbers preferably within a range of the equivalent numbers satisfying $Y>X \geq Y/3$. When they are reacted further with an isocyanate group-containing product represented by Formula (3) and/or a diisocyanate compound described above (Starting material 3, isocyanate equivalent number: Z equivalent(s)), the amounts in terms of equivalent numbers, of Starting materials 1, 2 and 3 should satisfy the relationship of the equivalent numbers represented by $Y>(X+Z) \geq Y/3$ and $0.2 \leq (Z/X) \leq 5$. In case of $Y<X$ or $Y<(X+Z)$, polymerization is effected in an isocyanate group-excessive system, which allows side reactions to take place readily and leads to a difficulty in controlling the reaction, while in case of $X<Y/3$ or $(X+Z)<Y/3$, an acid anhydride is present in a large excess, due to which a molecular weight sufficient to exert a performance can not be obtained. In case of $0.2>(Z/X)$, a flexible butadiene backbone is present in a large proportion, which yields a highly pliable resin but results in an insufficient heat resistance at the same time, while in case of $(Z/X)>5$, a polyimide backbone is present in a large proportion, which leads to a poor solubility in a solvent, resulting in a higher viscosity of the solution and precipitation of the imide component, which leads to a difficulty in handling.

The bifunctional polybutadiene having a number average molecular weight of 800 to 5,000 to be employed in the synthesis of an isocyanate group-containing product represented by Formula (3) which is Starting material 1 for modified polyimide resins according to the present invention, includes those whose unsaturated bonds have been hydrogenated, and can for example be, but are not limited to, "G-1000", "G-3000", "GI-1000", and "GI-3000" (all produced by NIPPON SODA) and "R-45EPI" (produced by IDEMITSU PETROCHEMICAL).

The diisocyanate to be employed in the synthesis of an isocyanate group-containing product represented by Formula (3) which is Starting material 1 for modified polyimide resins according to the present invention, includes, but is not limited to, toluene-2,4-diisocyanate, toluene-2,6-diisocyanate, hexamethylene diisocyanate, xylylene diisocyanate, diphenylmethane diisocyanate, isophoronediisocyanate and the like.

The tetrabasic acid dianhydride represented by Formula (1) (Compound b) to be employed as Starting material 2 for modified polyimide resins according to the present invention can for example be, but is not limited to, pyromellitic dianhydride, benzophenonetetracarboxylic dianhydride, biphenyltetracarboxylic dianhydride, naphthalene tetracarboxylic dianhydride, 5-(2,5-dioxotetrahydrofuryl)-3-methyl-cyclohexene-1,2-dicarboxylic anhydride, 3,3'-4,4'-diphenylsulfonetetracarboxylic dianhydride, 1,3, 3a, 4,5,9b-hexahydro-5-(tetrahydro-2,5-dioxo-3-furanyl)-naphtho[1,2-C]furane-1, 3-dione and the like.

The diisocyanate compound (Compound c) described above to be used as Starting material 3 for modified polyimide resins according to the present invention can for example be, but is not limited to, toluene-2,4-diisocyanate, toluene-2,6-diisocyanate, hexamethylene diisocyanate, xylylene diisocyanate, diphenylmethane diisocyanate, isophorone diisocyanate and the like.

The modified polyimide resin of the present invention can be obtained by reacting the three (3) kinds of compounds, i.e., a bifunctional hydroxyl-terminal polybutadiene having a number average molecular weight of 800 to 5,000 (Compound a), a tetrabasic acid dianhydride (Compound b) and a diisocyanate compound (Compound c), and, in a preferred procedure, a bifunctional hydroxyl-terminal polybutadiene having a number average molecular weight of 800 to 5,000 (Compound a) and a diisocyanate compound (Compound c) are charged first into a reactor in amounts in terms of an equivalent number ratio of hydroxyl groups:isocyanate groups of 1:1.5 to 2.5 and reacted in an organic solvent at a temperature of 80° C. or below for 1 to 8 hours, and then the resulting isocyanate group-containing polybutadiene resin solution thus obtained is allowed to cool to room temperature, and then added with a tetrabasic acid dianhydride (Compound b) in an excessive amount over the isocyanate group, on the basis of the equivalent ratio, together with a reaction catalyst, and also with an additional organic solvent if necessary. The reaction mixture is kept at 120 to 150° C. for 2 to 24 hours to carry out the reaction to the endpoint where all of the isocyanate groups have been reacted, or, alternatively, the reaction mixture is, for example dropwise, added with a diisocyanate compound and then kept at 120 to 150° C. for 2 to 24 hours to effect polymerization to the endpoint where all of the isocyanate groups have been reacted, whereby obtaining an intended product. In the reaction described above, it is preferable that the acid anhydride equivalent number is equal to, or higher than, the isocyanate group equivalent number, and, at the same time, the isocyanate group equivalent number is equal to, or higher than, one-third of the acid anhydride equivalent number.

The organic solvent to be employed for the reaction described above can for example be a polar solvent such as N,N'-dimethylformamide, N,N'-diethylformamide, N,N'-dimethylacetoamide, N,N'-diethylacetoamide, dimethylsulfoxide, diethylsulfoxide, N-methyl-2-pyrrolidone, tetramethylurea, γ-butyrolactone, cyclohexanone, diglyme, triglyme, carbitol acetate, propylene glycol monomethylether acetate, propyleneglycol monoethylether acetate or the like. Such solvents can be employed alone or as a solvent mixture of two or more thereof. Any of these polar solvents can also be combined with a non-polar solvent such as aromatic hydrocarbons.

The reaction catalyst for the reaction described above can for example be a tertiary amine such as tetramethylbutane diamine, benzylmethylamine, triethanolamine, triethylamine, N,N'-dimethylpyperidine, α-methylbenzyldimethylamine, N-methylmorpholine, triethylenediamine or the like, and an organic metal catalyst such as dibutyltin laurate, dimethyltin dichloride, cobalt naphthenate, zinc naphthenate or the like, each of which can be used alone or two or more of which can be used in combination, with triethylenediamine being most preferred.

The modified polyimide resin-comprising resin composition of the present invention comprises, as the essential component, a polybutadiene polyol having a number average molecular weight of 1,000 to 8,000 and having 2 to 10 hydroxyl groups per molecule (Component A), a modified polyimide resin represented by Formula (4) shown above (Component B) and a polybutadiene polyblock isocyanate having a number average molecular weight of 1,000 to 8,000 and having 2 to 10 block isocyanate groups per molecule (Component C), wherein the weight ratio of Component A and Component B is preferably a (A):(B) ratio of 40:60 to 90:10 in terms of solid matter, and also wherein the amount in terms of equivalent number of said polyblock isocyanate is preferably 0.8 to 3.5 times the sum of the hydroxyl group equivalent number of Component A and the acid anhydride equivalent number of Component B.

A polybutadiene polyol having a number average molecular weight of 1,000 to 8,000 and having 2 to 10 hydroxyl groups per molecule (Component A) in the resin composition described above is important for providing both of the characteristics of rigid resins such as heat resistance, chemical resistance and the like and those of pliable resins such as flexibility, reduced shrinkage and the like. A molecular weight less than the range specified above or a number of the hydroxyl groups per molecule exceeding the range specified above causes a higher crosslinking density upon setting of a resin composition described above, which leads to a harder mass or article resulting in difficulties in obtaining satisfactory physical properties such as pliability of a hardened coat film and a reduced shrinkage upon setting. On the other hand, a molecular weight exceeding the range specified above or a number of the hydroxyl groups per molecule less than the range specified above causes a lower crosslinking density upon setting, which leads to a more pliable mass or article but also to a markedly reduced heat resistance or chemical resistance of a hardened coat film. In addition, since Component A has a polybutadiene backbone, the reduced shrinkage upon setting and the pliability of a hardened mass or article can further be increased.

Since a modified polyimide resin represented by Formula (4) in the resin composition described above has a reduced number of functional groups and a suitable molecular weight and also has pliability attributable to the butadiene backbone, it is important to impart the resin composition with a reduced shrinkage upon setting and also to impart a hardened coat film with pliability. In addition, since it also has an imide backbone which contributes to heat resistance and chemical resistance, it is important to achieve both of the pliability and the heat and chemical resistances, to some extent, at the same time. Furthermore, since this resin has polybutadiene units, it can form an extremely uniform mixture with a polybutadiene polyol having a number average molecular weight of 1,000 to 8,000 and having 2 to 10 hydroxyl groups per molecule (Component A) and a polybutadiene polyblock isocyanate having a number average molecular weight of 1,000 to 8,000 and having 2 to 10 block isocyanate groups per molecule (Component C), and can be incorporated characteristically firmly into the crosslinking system formed by Component A and Component C. Accordingly, the addition of Component B is further effective in obtaining pliability and reduced shrinkage upon setting while suppressing an adverse effect on excellent characteristics of the crosslinking system established by Component A and Component C such as heat resistance, chemical resistance, moisture resistance and the like.

A polybutadiene polyblock isocyanate having a number average molecular weight of 1,000 to 8,000 and having 2 to 10 block isocyanate groups per molecule (Component C) in the resin composition described above is important for providing both of the characteristics of rigid resins such as heat resistance, chemical resistance and the like and the characteristics of pliable resins such as flexibility, reduced shrinkage and the like. A molecular weight less than the range specified above or a number of the hydroxyl groups per molecule exceeding the range specified above causes a higher crosslinking density upon setting of a resin composition described above, which leads to a harder mass or article resulting in difficulties in obtaining satisfactory physical properties such as a reduced shrinkage upon setting and pliability of a hardened coat film. On the other hand, a molecular weight exceeding the range specified above or a number of the hydroxyl groups per molecule less than the range specified above causes a lower crosslinking density upon setting, which leads to a more pliable mass or article but also to a markedly reduced heat resistance or chemical resistance of a hardened coat film. In addition, since Component C has a polybutadiene backbone, the reduced shrinkage upon setting and the pliability of a hardened mass or article can further be improved.

When a polybutadiene polyol (Component A) alone is hardened with a polybutadiene polyisocyanate (Component C), the hardened mass or article becomes relatively well-balanced in terms of the heat and chemical resistance vs the reduced shrinkage upon setting and the pliability of the hardened mass or article. The reduced shrinkage upon setting and the pliability of the hardened mass or article are, however, still on insufficiently satisfactory levels, due to which the combination with a modified polyimide resin (Component B) is essential. Thus, mixed use at a ratio within the range represented by (A):(B)=40:60 to 90:10 is preferable, and an amount of a polyol (Component A) less than this range results in too a reduced crosslinking density, which leads to a marked reduction in the heat resistance or the chemical resistance of the coating formed. The amount in terms of equivalent number of the polybutadiene polyblock isocyanate (Component C) is 0.8 to 3.5 times the sum of the hydroxyl group equivalent number of Component A and the acid anhydride equivalent number of Component B, departing from which results in too a reduced crosslinking density, which leads to a marked reduction in the heat resistance, the chemical resistance or the like of the coat film formed.

The polybutadiene polyol (Component A) can be any one having a number average molecular weight of 1,000 to 8,000, having 2 to 10 hydroxyl groups per molecule and also having a butadiene backbone, and can for example be, but are not limited to, "G-1000", "GI-1000", and "GQ-1000" (all produced by NIPPON SODA) and "R-45EPI" (produced by IDEMITSU PETROCHEMICAL).

The polybutadiene polyblock isocyanate (Component C) is one obtainable by blocking an isocyanate group-containing polybutadiene polyisocyanate with a blocking agent. Such polybutadiene polyisocyanate can for example be one obtainable by reacting a diisocyanate such as toluene-2,4-diisocyanate, toluene-2,6-diisocyanate, hexamethylene diisocyanate, xylylene diisocyanate, diphenylmethane diisocyanate, isophorone diisocyanate or the like, or a derivative thereof which has been imparted with three functionalities or more by means of the cyclization trimerization reaction of isocyanate groups or by means of the reaction of a part of the isocyanate groups with various polyols, with a hydroxyl group-containing polybutadiene having a number average molecular weight of 600 to 7,000, and includes "TP-1002" (produced by NIPPON SODA) and "HTP-9", "HTP-5MLD", and "UNIMAX P" (all produced by IDEMITSU PETROCHEMICAL) and the like. As the blocking agent, a compound which has only one active hydrogen, per molecule, capable of being reacted with an isocyanate group and is dissociated again at 170° C. or higher even after being reacted with the isocyanate group, is preferred, including, but not limited to, ε-caprolactam, diethyl malonate, ethyl acetoacetate, acetoxime, methylethylketoxime, phenol, cresol and the like.

The resin composition comprising a modified polyimide resin of the present invention can also comprise, in addition to the essential components described above, various additives employed customarily in this field, such as a setting promoter for polyols and isocyanates, a filler, an auxiliary agent, a thixotropy-imparting agent, a solvent and the like. It is desirable to add rubber microparticles especially for the purpose of further improving folding resistance, while it is desirable to add polyamide microparticles for the purpose of obtaining a further closer contact with an underlying copper circuit, with a polyimide or polyester film base substrate, or with an adhesive layer.

The rubber microparticle can be any resin microparticle which has been made to be insoluble in an organic solvent, or to be unmeltable and is obtainable by subjecting a resin exhibiting a rubber elasticity such as acrylonitrile butadiene rubber, butadiene rubber and acrylic rubber to a chemical crosslinking treatment, including, but not limited to, "XER-91" (available from NIPPON SYNTETIC RUBBER), "STAPHILOID AC3355", "STAPHILOID AC3832", and "IM101" (all produced by TAKEDA CHEMICAL INDUSTRIES", "PARALOID EXL2655", and "PARALOID EXL2602" (all produced by KUREHA) and the like.

The polyamide microparticle can be any microparticle having a particle size of 50 microns or less and made of a resin having amide bond(s), including an aliphatic polyamide such as nylon, an aromatic polyamide such as KEPLER and a polyamideimide, and can for example be, but is not limited to, "VESTOSINT 2070" (produced by DICEL-HUELS), "SP500" (produced by TORAY), and the like.

BEST MODE FOR CARRYING OUT THE INVENTION

Figure 1:
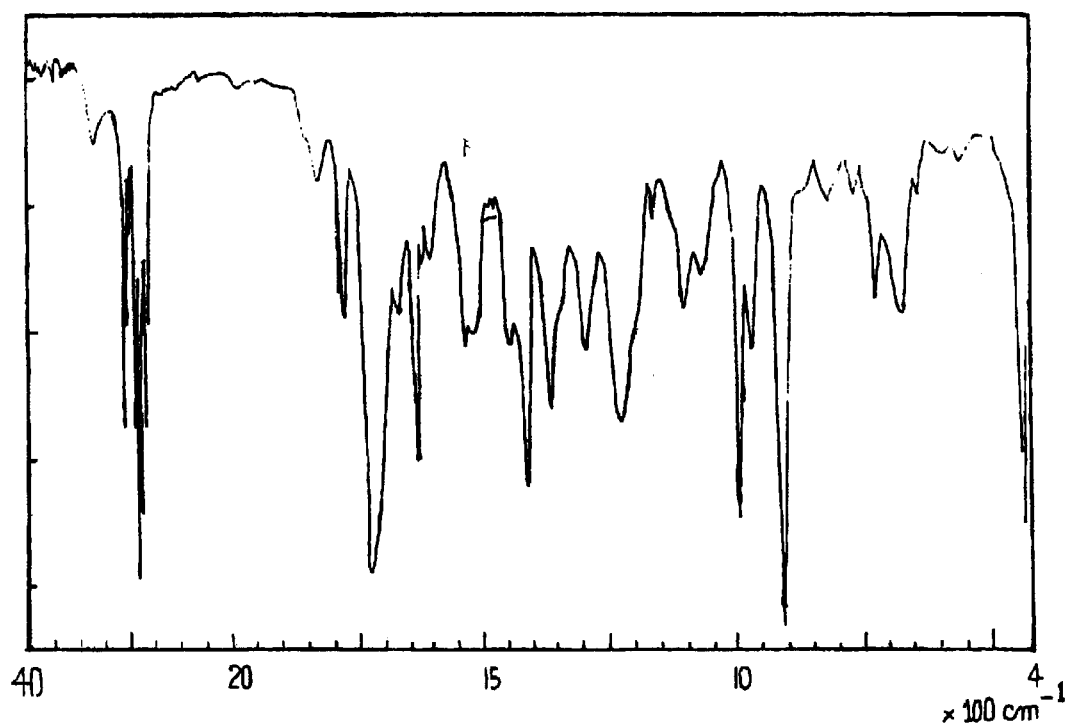
FIG. 1 shows an infrared absorption spectrum (FT-IR) of an example of the modified polyimide resin represented by Formula (4) (See Production example 1).

The production examples of modified polyimide resins of the present invention as well as polyblock isocyanates according to the present invention and the examples of the present invention will be described in more detail with referring to the comparative examples.

PRODUCTION EXAMPLE 1

Production of a Modified Polyimide Resin Represented by Formula (4) (Resin varnish E)

A reactor received 50 g of "G-3000" (OH-terminal polybutadiene, Mn=approximately 3,000, OH equivalent=1,798 g/eq., and solid matter=100% by weight, produced by NIPPON SODA), 23.5 g of "IPUZOL 150" (produced by IDEMITSU PETROCHEMICAL) and 0.007 g of dibutyltin laurate, which were mixed and dissolved uniformly. A uniform mixture was then heated to 50° C. and added with 4.8 g of toluene-2,4-diisocyanate (NCO equivalent=87.08 g/eq.) with stirring continuously, followed by carrying out the reaction for 2 to 4 hours. Subsequently, the reaction mixture was cooled to room temperature and added with 8.83 g of benzophenone tetracarboxylic dianhydride (acid anhydride equivalent=161.1), 0.07 g of triethylene diamine and 74.09 g of triglyme, which were heated to 130° C. with stirring, followed by carrying out the reaction for 2 to 6 hours. When the disappearance of the NCO peak at 2,250 $cm^{-1}$ was confirmed on the basis of an infrared absorption spectrum (FT-IR), 1.43 g of toluene-2,4-diisocyanate (NCO equivalent=87.08 g/eq.) was further added, followed by carrying out the reaction further at 130° C. for 2 to 6 hours while observing the disappearance of the NCO on the basis of FT-IR. The time point when the disappearance of the NCO was regarded as the endpoint of the reaction, and the reaction mixture was allowed to cool to room temperature, and then filtered through 100-mesh filter cloth to obtain a modified polyimide resin represented by Formula (4) (Resin varnish E) (FIG. 1).

Characteristics of Resin varnish E: Logarithmic viscosity=0.31 (30° C., NMP solution); acid anhydride equivalent (including solvent)=14,708 g/eq. ; and solid mater=40% by weight.

The polymer solution used for determining the logarithmic viscosity was prepared by pouring the Resin varnish E into methanol to precipitate the resin solid exclusively, followed by filtering,drying and then dissolving in N-methylpyrrolidone at a concentration of 0.5 g/dL.

PRODUCTION EXAMPLE 2

Production of Block Isocyanate (Resin varnish F)

A reactor received 1,000 g of "HTP-9" (NCO-terminal polybutadiene, NCO equivalent=467 g/eq. , solid matter=

100% by weight, manufactured by IDEMITSU PETROCHEMICAL), 216 g of ethyldiglycol acetate (manufactured by DICEL) and 0.1 g of dibutyltin laurate, which were mixed and dissolved uniformly. A uniform mixture was then heated to 70° C. and added dropwise with 224 g of methylethylketoxime (molecular weight=87.12) over a period of 2 hours with stirring continuously, and then kept at the same temperature for further 1 hour. When the disappearance of the NCO peak at 2,250 cm$^{-1}$ was confirmed on the basis of the infrared absorption spectrum (FT-IR) shown in FIG. 1, the mixture was cooled to obtain a block isocyanate (Resin varnish F).

Characteristics of Resin varnish F: NCO equivalent= 672.5 g/eq. ; and solid matter 85% by weight.

<Evaluation of Coat Film>

(1) Warp or curl upon curing shrinkage: A coating in a size of 25 mm×35 mm×25 μm on a polyimide film in a size of 35 mm×60 mm×75 μm is examined for the degree of warping after curing.

(2) Folding resistance test: Mandrel test; A folding test is performed within a diameter range of 1 to ⅛ inch. The results are represented by a minimum diameter where no cracking occurs.

(3) Electric insulation: Sample is coated on a tandem electrode whose conductor width is 0.318 mm, and electric resistance after boiling for 1 hour is measured.

(4) Chemical resistance: A coating is rubbed with a waste soaked with acetone or isopropanol. The results are expressed as o when there is no abnormality and as x when the coating is deteriorated.

(5) Heat resistance upon soldering: A Flux JS-64MS-S is applied onto a coating, which is immersed in a solder bath at 260° C. for 10 seconds. The results are expressed as oo when there is no abnormality, as o when a slight blister is formed, and as x when a marked blister is formed.

(6) Folding resistance: Folding resistance is tested in accordance with JIS C5016. The folding radius is 0.38 mm, and the number of the repeated foldings is counted until cracking occurs. The results were expressed as x when the number is 10 or less, as Δ when the number is 10 to 1,000, as o when the number is 1,000 to 2,000, and as oo when the number is 2,000 or more.

(7) Adherence (onto IC confining resins): Onto a TAB tape whose copper has been etched whereby the adhesive layer is uncovered, a resin composition is coated in a thickness of about 25 μm, and then cured to form a coat film. Onto the coat film thus formed, an IC confining resin is applied in a thickness of about 200 μm and cured to obtain a test piece. The test piece is folded manually while it is being observed how the confining resin peel off.

IC confining resin A: "XS8103" (produced by Namics Corp.)

IC confining resin B: "XS8107" (produced by Namics Corp.)

The results are expressed as x when the interfacial failure is observed between the composition coating and the confining resin, as Δ when cohesive failure of each of the composition coating and the confining resin and interfacial failure are both observed, where the cohesive failure< the interfacial failure, as o when cohesive failure of each of the composition coating and the confining resin are both observed, where the cohesive failure> the interfacial failure; and as oo when each of the composition coating and the confining resin undergoes cohesive failure.

(8) Adherence (onto copper or polyimide): The test was performed in accordance with JIS D0202.

Polyimide: "UBELEX S" (produced by UBE INDUSTRIES)

The results expressed as x: 0/100 to 50/100; as Δ: 51/100 to 99/100; and as o: 100/100.

EXAMPLES 1 to 3

(a) Preparation of thermosetting resin composition:

Component A (polybutadiene polyol): "GQ-2000" (OH-terminal polybutadiene, Mn=approximately 2,500, OH equivalent=1,042 g/eq. , and solid matter=45% by weight, produced by NIPPON SODA).

Component B (modified polyimide resin): Resin varnish E (acid anhydride-terminal resin, acid anhydride equivalent (including solvent)=14,708 g/eq. , and solid matter=40% by weight.

Polyol other than Components A and B: "LIR-506" (OH-group containing polyisoprene, Mn=approximately 25,000, OH equivalent=4,237 g/eq. , and solid matter=100% by weight).

Component C (polybutadiene polyblock isocyanate): Resin varnish F (NCO-terminal polybutadiene, NCO equivalent=672.5 g/eq., and solid matter=85% by weight).

The polyol, the modified polyimide resin and the polyblock isocyanate described above were formulated appropriately, together with dibutyltin laurate as a setting promoter, "Aerosil 200" (produced by NIPPON AEROSIL) as an anti-sagging agent, and carbitol acetate as a viscosity-adjusting solvent in appropriate amounts for respective formulations, and kneaded using a three roll mill to prepare Samples A1 to A3 indicated in Table 1 shown below. (b) Coating evaluation:

Each of Samples A1 to 3 was applied onto a certain substrate to a dry thickness of about 25 μm, and hardened at 150° C. for 60 minutes to obtain each test sample (coating). Various parameters of each coating were determined, and the results are indicated in Table 2 shown below. Any value in the table is of parts by weight including the solvent in the starting material.

TABLE 1

| Number | | Examples | | | Comparative examples | |
|---|---|---|---|---|---|---|
| Sample designation | | A1 | A2 | A3 | B1 | B2 |
| Component A | GQ-2000 | 15.6 | 15.6 | 15.6 | 10.0 | 15.6 |
| Component B | Resin varnish E | 7.5 | 7.5 | 7.5 | | |
| Component C | Resin varnish F | 11.3 | 11.3 | 11.3 | 6.5 | 10.6 |
| Rubber microparticle | XER-91 | | | 1 | | |
| Polyamide microparticle | VESTSINT 2070 | | 1 | 1 | | |
| Other polyol | LIR-506 | | | | | 3 |

*) A value in the table is of parts by weight including the solvent in the starting material.

COMPARATIVE EXAMPLES 1 to 4

Similarly to Examples, Samples B1 to 2 were prepared using the compositions indicated in Table 1 shown above, and, among overcoat agents employed usually for current film carriers, an epoxy-based "CCR-232GF" (produced by ASAHIKAGAKU KENKYUSHO) and a polyimide-based "FS-100L" (produced by UBE INDUSTRIES) were selected as Comparative examples 3 and 4, respectively, and the results are summarized in Table 2.

TABLE 2

| Number | Examples | | | Comparative examples | | | |
|---|---|---|---|---|---|---|---|
| Sample designation | A1 | A2 | A3 | B1 | B2 | B3 | B4 |
| Warp (mm) | 0.4 | 0.4 | 0.3 | 0.9 | 0.3 | 9.0 | 0.3 |
| Mandrel | ⅛> | ⅛> | ⅛> | ⅛> | ⅛> | 1 | ⅛> |
| Electric insulation (ohm) | 10th power | 10th power | 10th power | 10th power | 9th power | 9th power | 10th power |
| Chemical Resistance | | | | | | | |
| Isopropanol | O | O | O | O | Δ | O | Δ |
| Acetone | O | O | O | O | Δ | O | Δ |
| Heat resistance upon soldering | OO | OO | OO | OO | × | OO | O |
| Folding resistance | O | O | OO | Δ | Δ | × | OO |
| Adherence onto | | | | | | | |
| Confining resin A | O | OO | OO | Δ | O | OO | × |
| Confining resin B | O | OO | OO | Δ | O | OO | × |
| Polyimide | O | O | O | O | O | O | O |
| Copper | O | O | O | O | O | O | O |

Industrial Applicability

As shown in Examples, the resin composition of the present invention is a thermosetting resin composition which is excellent especially in terms of the warping upon setting and provides a hardened article whose pliability, chemical resistance, heat resistance, electric insulation and adherence are all excellent, and therefore, is useful as an overcoat for flexible circuit, and can be expected to serve also as an overcoat for a film carrier satisfactorily.

What is claimed is:

1. A polyimide resin represented by Formula (2):

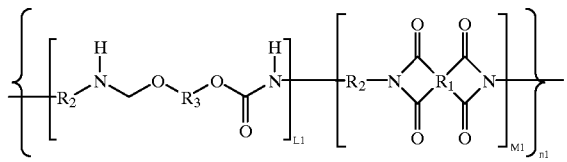

(2)

wherein

R$_1$ represents a residue obtainable by removing all the carboxyl groups from an organic compound having 4 carboxyl groups, R$_2$ represents a residue obtainable by removing all the isocyanate groups from an organic compound having 2 isocyanate groups, and R$_3$ represents a residue obtainable by removing the hydroxyl group from a hydroxyl-terminal polybutadiene; L1 represent the ratio of the number of the component polybutadiene units and M1 the ratio of the number of the component polyimide units, respectively, to the total number of both L1 and M1; and n1 1 to 10,000, provided that L1+M1=1, 0<L1<1,0<M1<1.

2. A method of preparing the polyimide resin of claim 1, comprising: reacting a bifunctional hydroxyl-terminal polybutadiene having a number average molecular weight of 800 to 5,000, a tetrabasic acid dianhydride represented by Formula (1):

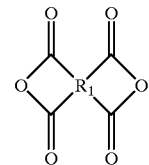

(1)

wherein

R$_1$ represents a residue obtainable by removing all the carboxyl groups from an organic compound having 4 carboxyl groups, and a diisocyanate compound.

3. A method of preparing the polyimide resin of claim 1, comprising:

reacting X equivalents of an isocyanate group-containing product represented by the Formula (3):

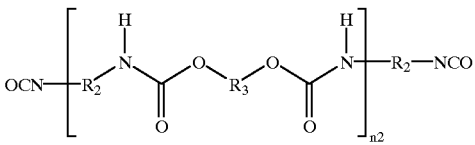

(3)

wherein

R$_2$ represents a residue obtainable by removing all the isocyanate groups from an organic compound having 2 isocyanate groups, and R$_3$ represents a residue obtainable by removing the hydroxyl group from a hydroxyl-terminal polybutadiene; n2 represents 0–100 and Y equivalents of the tetrabasic dianhydride of the formula (1).

4. The method of claim 3, wherein said isocyanate group-containing product is obtained by reacting a bifunctional hydroxyl-terminal polybutadiene having a number average molecular weight of 800 to 5,000 and a diisocyanate compound with a isocyanate group ratio of 1:1.5 to 2.5.

5. The method of claim 3, wherein Y<X≦Y/3,0<X and 0<Y.

6. A polyimide resin represented by Formula (4):

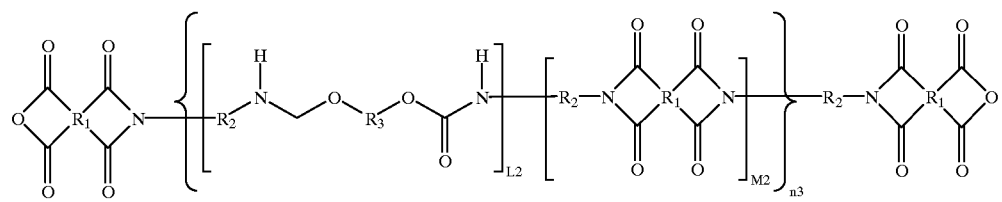

(4)

wherein

R$_1$ represents a tetrabasic acid, R$_2$ represents a residue obtainable by removing all the isocyanate groups from an organic compound having 2 isocyanate groups, and R$_3$ represents a residue obtainable by removing the hydroxyl group from a hydroxyl terminal polybutadiene; L1 represent the ratio of the number of the component polybutadiene units and M1 the ratio of the number of the component polyimide units, respectively, to the total number of both L1 and M1 and n3 represents 1 to 1000, provided that L2+M2=1, 0<L2<1,0<M2<1.

7. The method of making the polyimide resin of claim 1, comprising:

reacting a compound of Formula (4):

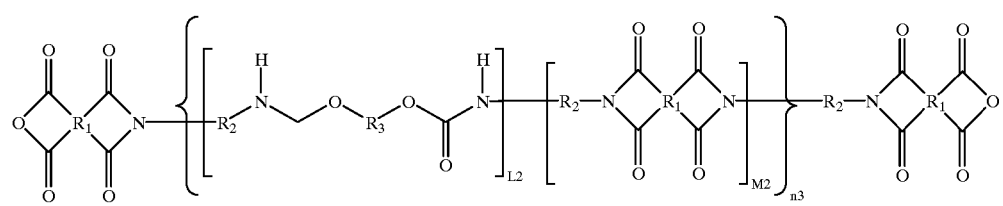

wherein

R$_1$ represents a tetrabasic acid, R$_2$ represents a residue obtainable by removing all the isocyanate groups from an organic compound having 2 isocyanate groups, and R$_3$ represents a residue obtainable by removing the hydroxyl group from a hydroxyl terminal polybutadiene; L1 represent the ratio of the number of the component polybutadiene units and M1 the ratio of the number of the component polyimide units, respectively, to the total number of both L1 and M1 and n3 represents 1 to 1000, provided that L2+M2=1, 0<L2<1,0<M2<1, a compound of Formula (3):

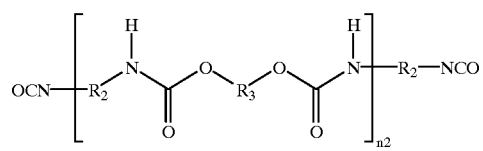

wherein

R$_2$ represents a residue obtainable by removing all the isocyanate groups from an organic compound having 2 isocyanate groups, and R$_3$ represents a residue obtainable by removing the hydroxyl group from a hydroxyl-terminal polybutadiene; n2 represents 0–100; and a diisocyante compound.

8. A method of making the polyimide of claim 6, comprising reacting X equivalents of a compound of Formula (3):

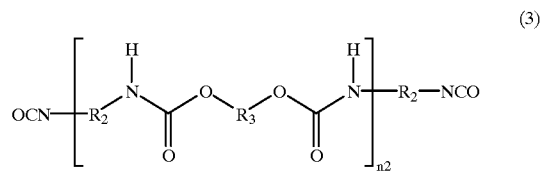

wherein

R$_2$ represents a residue obtainable by removing all the isocyanate groups from an organic compound having 2 isocyanate groups, and R$_3$ represents a residue obtainable by removing the hydroxyl group from a hydroxyl-terminal polybutadiene; n2 represents 0–100;

Y equivalents of a compound of Formula (1):

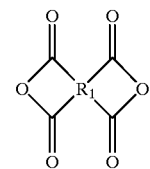

wherein

R$_1$ represents a residue obtainable by removing all the carboxyl groups from an organic compound having 4 carboxyl groups; and Z equivalents of a diisocyanate compound;

wherein Y>(X+Z)2Y/3,0.2<(Z/X)≦5,0<X, 0<Y and 0≦Z.

9. A resin composition comprising (A) a polybutadiene polyol having a number average molecular weight of 1,000 to 8,000 and having 2 to 10 hydroxyl groups per molecule;

(B) the polyimide of claim 6; and (C) a polybutadiene polyblock isocyanate having a number average molecular weight of 1,000 to 8,000 and having 2 to 10 block isocyanate groups per molecule; wherein (A):(B) is 40:60 to 90:10 by weight, and wherein the polybutadiene polyblock isocyanate is in an amount of 0.8 to 3.5 times the sum of the hydroxyl group equivalent number of (A) and the acid anhydride equivalent number of (B).

10. The resin of claim 9 further comprising rubber microparticles.

11. The resin of claim 9 further comprising polyimide microparticles.

12. A method of making a thermosetting insulating layer on a surface comprising applying the resin of claim 9 to said surface.

13. A method of making a flexible circuit overcoat on a surface comprising applying the resin of claim 9 to said surface.

14. A film carrier comprising an insulating film and a metal thin film pattern formed thereon, and an overcoat comprising the resin of claim 9.

* * * * *